Figure 1:
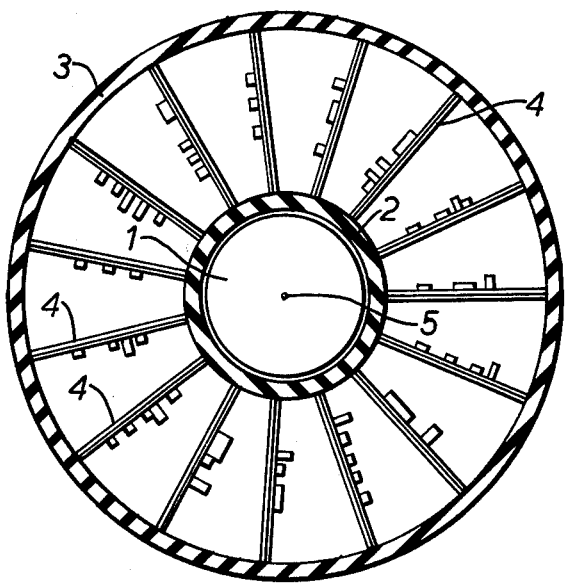

United States Patent [19]
Richmond et al.

[11] 4,101,933
[45] Jul. 18, 1978

[54] TELEVISION CAMERAS

[75] Inventors: Michael Richmond, Witham; Richard Michael Hesketh Prichard, Stock, both of England

[73] Assignee: Elliott Brothers (London) Limited, England

[21] Appl. No.: 710,668

[22] Filed: Aug. 2, 1976

[30] Foreign Application Priority Data

Aug. 9, 1975 [GB] United Kingdom ............... 33291/75

[51] Int. Cl.² .............................................. H04N 5/64
[52] U.S. Cl. .................................................... 358/254

[58] Field of Search ...................... 358/254, 217, 224; 325/352, 355

[56] References Cited

U.S. PATENT DOCUMENTS

| 2,712,035 | 6/1955 | Jackson | 358/224 |
| 3,944,892 | 3/1976 | Johnson et al. | 358/254 |

Primary Examiner—Richard Murray

[57] ABSTRACT

A television camera contains its electrode sub-assemblies mounted on printed circuit boards which extend radially from the central axis of the camera tube. The camera is provided with a cast spherical housing having a window located on the axis of the camera tube.

11 Claims, 4 Drawing Figures

TELEVISION CAMERAS

This invention relates to television cameras and seeks to provide improved such cameras.

According to this invention a television camera comprises a television camera tube and a plurality of electronic sub-assembly units for use therewith, wherein said sub-assembly units are distributed around said tube and extend in planes which are angularly spaced around the axis of said camera tube.

Preferably each sub-assembly unit comprises a printed circuit board, or equivalent substrate, carrying electronic components, each substrate extending in a plane which extends radially from the axis of said camera tube.

Preferably said last mentioned planes are substantially equally angularly spaced around the axis of said camera tube.

Preferably each substrate includes edge electrical connectors extending in the direction of the axis of the tube and an annular member, extending in a plane perpendicular to the axis of the camera tube and provided to encircle said tube, is provided with a number of radially extending series of connectors each arranged to make contact with the edge connectors of a different substrate.

Preferably said camera tube and said substrates are housed in a generally spherical housing, preferably of a cast alloy material such as aluminum.

Preferably said housing is divided into two separable portions one of which supports said tube and said sub-assembly units, whilst the other removes as a lid. Preferably said two portions are half-portions. Normally the portion which removes as a lid is a portion encompassing said annular member, whereby by removing said portion said annular member and said substrates may be removed, preferably whilst still united. Normally again this last mentioned portion of the casing will be the portion carrying said window.

If desired, in order for example to accommodate a long lens, such as a motorised zoon lens, a hollow generally cylindrical, shell portion may be introduced between said two portions.

In some cases it may be required to incorporate an electronic view-finder in the camera in which case a window for said view-finder may be provided in said housing diametrically opposite an input window for said camera tube. If necessary a protuberance may be provided in said housing to accommodate said view-finder. Preferably any such view-finder comprises a display tube and a plurality of electronic sub-assembly units for use therewith distributed around said display tube and extending in planes which are angularly spaced around the axis of said display tube.

Normally said housing will be spherical except for a protuberance housing an input window for said camera tube, a protuberance housing an electronic view-finder (if provided) and/or a window therefor, and a feed-through arrangement for operating electrical conductors.

Figure 2:
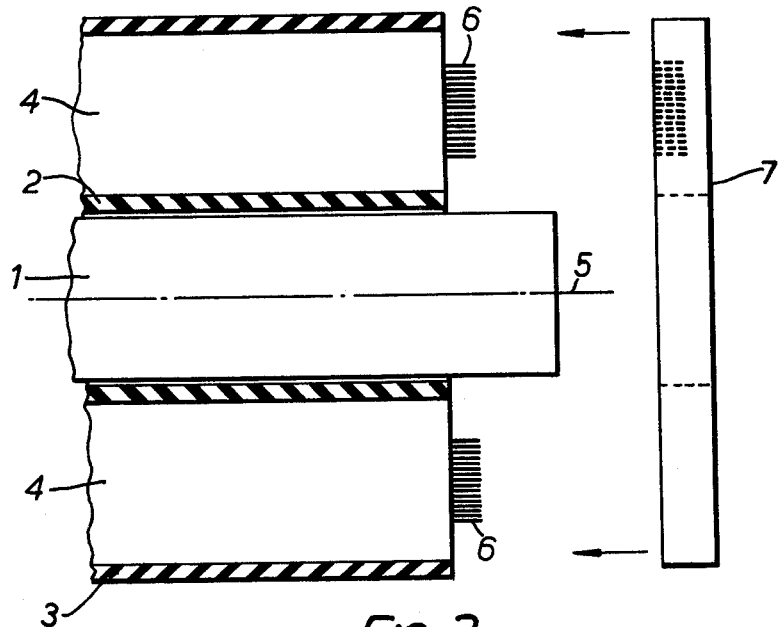
Figure 3:
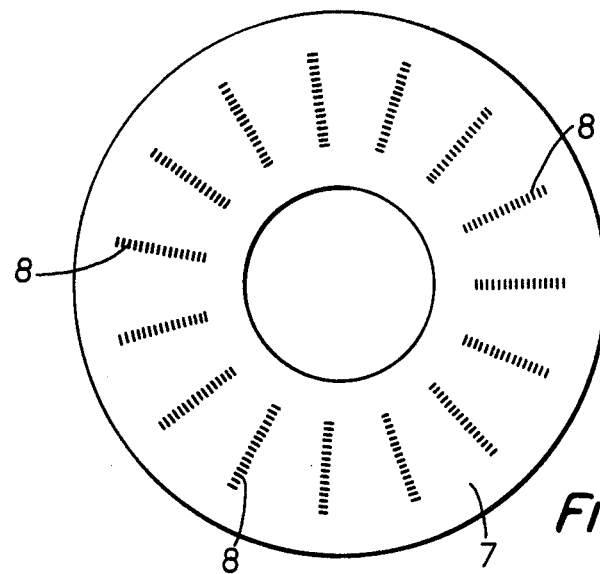
Figure 4:
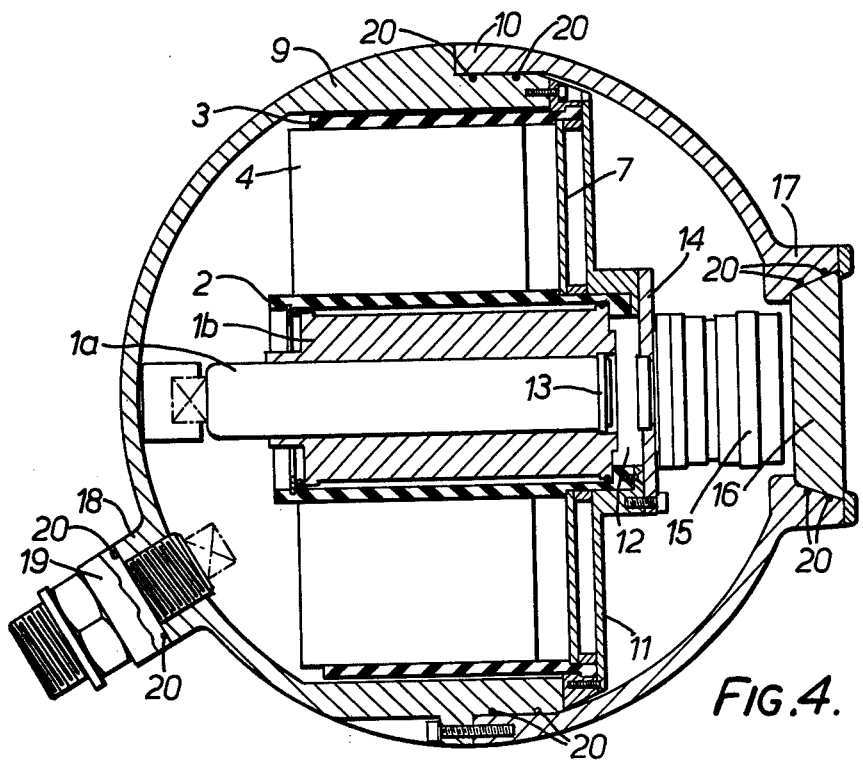

The invention is illustrated in and further described with reference to the accompanying drawings in which, FIG. 1 is a schematic cross section of one television camera in accordance with the present invention, FIG. 2 is a part broken away longitudinal section of the television camera of FIG. 1, showing the method of making connection to the various component carrying substrates, FIG. 3 is a plan view of the annular socket member 7 of FIG. 2 and FIG. 4 is a cross section of one example of a practical television camera in accordance with the present invention.

In all Figures like references are used for like parts.

Referring to FIGS. 1, 2 and 3, a television camera tube 1a with its yoke 1b, is carried by means of an insulating cylindrical member 2. Surrounding cylindrical insulating member 2 is a further cylindrical insulating member 3. Extending between members 2 and 3 are a plurality of electronic sub-assembly units 4, each of which is in the form of a printed circuit board carrying a number of electronic components, as represented. The printed circuit boards 4 lie in planes which extend radially from the axis 5 of the camera tube 1a and are angularly equally spaced from one another. In FIG. 1, fifteen printed circuit boards are shown, and this is in fact the number used in the practical television camera shown in FIG. 4.

In order to make connection to the printed circuit boards, each board is provided with a series of edge connector pins 6, best seen in FIG. 2, which face forward in the direction of the axis 5 of the tube 1a and in fact face towards the input end of the tube 1a. An annular member 7 is provided to extend in a plane perpendicular to the axis 5 of the tube and to surround the tube. The annular member 7 is provided with fifteen radially extending series of sockets 8, each of which series of sockets make contact with the edge connector pins of one of the printed circuit boards 4. Annular member 7 carries printed circuit wiring (not separately shown). The boards 4 and the annular member 7 are held together as a unit by clips (not shown).

Referring to FIG. 4, again the camera tube 1a and yoke 1b may be seen mounted in an insulating cylindrical member 2, whilst a further insulating cylindrical member 3 surrounds the latter. Again printed circuit boards 4 carrying electronic components (in this case not shown) can be seen to extend between the members 2 and 3. The boards are arranged precisely as schematically represented in FIGS. 1 and 2.

The annular member 7 is shown with its sockets united with the edge connector pins 6 of the boards 4 to form a unit which is held together by clips (not shown). The assembly consisting of the boards 4 united with annular member 7, tube and yoke 1a and 1b and cylindrical mounting members 2 and 3 are secured within one half-portion 9 of a spherical housing of which the other half-portion is referenced 10. The assembly above mentioned is secured within the housing portion 9 by means of a clamping plate member 11. The clamping member 11 has an aperture 12 adjacent the input window 13 of the camera tube 1, which aperture 12 is covered by an apertured plate 14 carrying a lens system 15 which extends towards a window 16 carried in a protuberance 17 in the second half-portion 10 of the housing. This housing is formed of cast aluminium. The first half-portion 9 of the housing also exhibits a protuberance 18 which carries a feed-through arrangement 19 for conductors (not shown) required to connect with the camera tube and, via annular member 7, the printed circuit boards 4 within the housing. Apart from the protuberances 17 and 18 the two-part housing is spherical. Sealing O rings are provided where indicated at 20 in order hermetically to seal the interior of the housing 9, 10 against external elements.

Whilst not illustrated, if desired, in order for example to accommodate a long lens, such as a motorised zoom lens, a hollow generally cylindrical shell portion may be introduced between said two housing portions 9, 10. Furthermore, if it is desired to incorporate an electronic view-finder, a window for the view-finder may be provided in housing portion 9 diametrically opposite input window 13 and, if necessary, a protuberance provided in housing portion 9 to accommodate the view-finder. This latter may be constructed in a manner similar to that in which the camera unit is constructed, that is to say it may comprise a display tube and a plurality of electronic sub-assemblies for use therewith distributed around the axis of the display tube and extending in planes which extend radially around the axis of the display tube and which are substantially equally angularly spaced one from another.

We claim:

1. A television camera comprising a television camera tube and a yoke within which the camera tube is at least partially disposed, and a plurality of electronic sub-assembly units distributed around said tube and outside of said yoke, each sub-assembly unit comprising a circuit board substrate, carrying electronic components, each substrate extending in a plane which extends radially from the axis of said camera tube.

2. A camera as claimed in claim 1 and wherein said last mentioned planes are substantially equally angularly spaced around the axis of said camera tube.

3. A camera as claimed in claim 1 and wherein each substrate includes edge electrical connectors extending in the direction of the axis of the tube and an annular member, extending in a plane perpendicular to the axis of the camera tube and provided to encircle said tube, is provided with a number of radially extending series of connectors each arranged to make contact with the edge connectors of a different substrate.

4. A camera as claimed in claim 3 wherein said housing is divided into two separable portions one of which supports said tube and said sub-assembly units, while the other removes as a lid, and wherein said lid is a portion encompassing said annular member, whereby by removing said portion said annular member and said substrates may be removed.

5. A camera as claimed in claim 4 and wherein the arrangement is such that said substrates may be removed whilst still united.

6. A camera as claimed in claim 4 and wherein said last mentioned portion of the casing is the portion carrying said window.

7. A camera as claimed in claim 1 and wherein said camera tube and said substrates are housed in a generally spherical housing.

8. A camera as claimed in claim 7 and wherein said housing is of a cast alloy material.

9. A camera as claimed in claim 7 and wherein said housing is divided into two separable portions one of which supports said tube and said sub-assembly units, whilst the other removes as a lid.

10. A camera as claimed in claim 9 and wherein said two portions are half-portions.

11. A camera as claimed in claim 9 and wherein a hollow generally cylindrical, shell portion is introduced between said two portions.

* * * * *